US006218083B1

(12) United States Patent
McCullough et al.

(10) Patent No.: US 6,218,083 B1
(45) Date of Patent: *Apr. 17, 2001

(54) PATTERN-FORMING METHODS

(75) Inventors: Christopher D. McCullough; Kevin B. Ray, both of Leeds; Alan S. Monk, Warrington; Stuart Bayes, Leeds; Anthony P. Kitson, Batley, all of (GB)

(73) Assignee: Kodak Plychrome Graphics, LLC, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/263,605

(22) Filed: Mar. 5, 1999

Related U.S. Application Data

(63) Continuation of application No. PCT/GB98/01957, filed on Jul. 2, 1998.

(30) Foreign Application Priority Data

| Jul. 5, 1997 | (GB) | 9714169 |
| Jul. 5, 1997 | (GB) | 9714172 |
| May 1, 1998 | (GB) | 9809346 |

(51) Int. Cl.$^7$ .................................................. G03F 7/30

(52) U.S. Cl. ......................... 430/326; 430/18; 430/190; 430/191; 430/192; 430/193; 430/320

(58) Field of Search .................................. 430/190, 191, 430/192, 193, 326, 18, 320

(56) References Cited

U.S. PATENT DOCUMENTS

| 2,766,118 | 10/1956 | Sus et al. .................... 95/7 |
| 2,767,092 | 10/1956 | Schmidt ........................ 95/7 |
| 2,772,972 | 12/1956 | Herrick, Jr. et al. ......... 96/33 |
| 2,859,112 | 11/1958 | Sus et al. ..................... 96/91 |
| 2,907,665 | 10/1959 | Fraher ......................... 106/49 |
| 3,046,110 | 7/1962 | Schmidt ........................ 96/33 |
| 3,046,111 | 7/1962 | Schmidt ........................ 96/33 |
| 3,046,115 | 7/1962 | Schmidt et al. ............... 96/33 |
| 3,046,118 | 7/1962 | Schmidt ........................ 96/33 |
| 3,046,119 | 7/1962 | Sus ............................... 96/33 |
| 3,046,120 | 7/1962 | Schmidt et al. ............... 96/33 |
| 3,046,121 | 7/1962 | Schmidt ........................ 96/33 |
| 3,046,122 | 7/1962 | Sus ............................... 96/33 |
| 3,046,123 | 7/1962 | Sus et al. ..................... 96/33 |
| 3,061,430 | 10/1962 | Uhlig et al. .................. 96/33 |
| 3,102,809 | 9/1963 | Endermann et al. .......... 96/33 |
| 3,105,465 | 10/1963 | Peters ......................... 122/37 |
| 3,628,953 | 12/1971 | Brinckman .................. 96/36.3 |
| 3,635,709 | 1/1972 | Kobayashi ................... 96/33 |
| 3,647,443 | 3/1972 | Rauner et al. ................ 96/33 |
| 3,837,860 | 9/1974 | Roos ........................... 96/91 D |
| 3,859,099 | 1/1975 | Petropoulos et al. ........ 96/90 R |
| 3,891,439 | 6/1975 | Katz et al. .................. 96/49 |
| 3,902,906 | 9/1975 | Iwana et al. ................. 96/190 |
| 4,063,949 | 12/1977 | Uhlig et al. ................. 96/27 E |
| 4,306,010 | 12/1981 | Uehara et al. ............... 430/190 |
| 4,306,011 | 12/1981 | Uehara et al. ............... 430/190 |
| 4,308,368 | 12/1981 | Kubo et al. .................. 525/504 |
| 4,356,254 | 10/1982 | Takashiet et al. ............ 430/296 |
| 4,493,884 | 1/1985 | Nagano et al. ............... 430/192 |
| 4,497,888 | 2/1985 | Nishioka et al. ............. 430/165 |
| 4,529,682 | 7/1985 | Toukhy ........................ 430/190 |
| 4,544,627 | 10/1985 | Takashi et al. ............... 430/325 |
| 4,576,901 | 3/1986 | Stahlhofen et al. .......... 430/325 |
| 4,609,615 | 9/1986 | Yamashita et al. ........... 430/325 |
| 4,684,599 | 8/1987 | DoMinh et al. .............. 430/270 |
| 4,693,958 | 9/1987 | Schwartz et al. ............. 430/302 |
| 4,708,925 | 11/1987 | Newman ...................... 430/270 |
| 4,789,619 | 12/1988 | Ruckert et al. ............... 430/270 |
| 4,927,741 | 5/1990 | Garth et al. .................. 430/309 |
| 4,966,798 | 10/1990 | Brosius et al. ............... 428/64 |

(List continued on next page.)

FOREIGN PATENT DOCUMENTS

| 0 557 138 | 8/1983 | (EP) . |
| 0 304 313 | 2/1989 | (EP) . |
| 0 327 998 | 8/1989 | (EP) . |
| 0 343 986 | 11/1989 | (EP) . |
| 0 366 590 | 5/1990 | (EP) . |
| 0 375 838 | 7/1990 | (EP) . |
| 0 390 038 | 1/1991 | (EP) . |
| 0 410 606 | 1/1991 | (EP) . |
| 0 424 182 | 4/1991 | (EP) . |
| 0 458 485 | 11/1991 | (EP) . |
| 0 517 428 | 12/1992 | (EP) . |
| 0 519 128 | 12/1992 | (EP) . |
| 0 519 591 | 12/1992 | (EP) . |
| 0 534 324 | 3/1993 | (EP) . |
| 0 608 983 | 8/1994 | (EP) . |
| 0 672 954 | 9/1995 | (EP) . |
| 0 706 899 | 4/1996 | (EP) . |
| 0 720 057 | 7/1996 | (EP) . |
| 0 780 239 | 8/1996 | (EP) . |
| 0 691 575 | 10/1996 | (EP) . |
| 0 803 771 | 10/1997 | (EP) . |
| 0 819 980 | 1/1998 | (EP) . |
| 0 839 647 | 5/1998 | (EP) . |
| 0 864 419 | 9/1998 | (EP) . |

(List continued on next page.)

OTHER PUBLICATIONS

"The Chemical Behavior of Positive Working Systems" by J.C. Strieter. Eastman Kodak Company, Rochester, New York pp. 116–122.

*Primary Examiner*—John S. Chu
(74) *Attorney, Agent, or Firm*—Ratner & Prestia

(57) ABSTRACT

A method for producing a predetermined resist pattern on e.g. a lithographic printing plate, circuit board or mask comprises the imagewise exposure of a radiation sensitive diazide-containing coating (conventionally considered as a UV sensitive material), to non-UV radiation, such as direct heat radiation or infra-red radiation. A positive of the exposed image is revealed on development. Additionally, it has been found that a flood exposure to UV radiation after the imagewise exposure to the non-UV radiation means that a negative of the exposed image is revealed, on development.

28 Claims, No Drawings

U.S. PATENT DOCUMENTS

| | | | |
|---|---|---|---|
| 5,002,853 | 3/1991 | Aoai et al. | 430/281 |
| 5,085,972 | 2/1992 | Vogel | 430/270 |
| 5,130,223 | 7/1992 | Nishimura et al. | 430/166 |
| 5,145,763 | 9/1992 | Bassett et al. | 430/169 |
| 5,149,613 | 9/1992 | Stahlhofen et al. | 430/296 |
| 5,200,292 | 4/1993 | Shinozaki et al. | 430/296 |
| 5,200,298 | 4/1993 | Takagi et al. | 430/264 |
| 5,202,221 | 4/1993 | Imai et al. | 430/283 |
| 5,208,135 | 5/1993 | Patel et al. | 430/281 |
| 5,227,473 | 7/1993 | Kawamura et al. | 534/557 |
| 5,279,918 | 1/1994 | Nishi et al. | 430/190 |
| 5,340,699 | 8/1994 | Haley et al. | 430/302 |
| 5,368,977 | 11/1994 | Yoda et al. | 430/190 |
| 5,372,907 | 12/1994 | Haley et al. | 430/157 |
| 5,372,915 | 12/1994 | Haley et al. | 430/302 |
| 5,372,917 | 12/1994 | Tsuchida et al. | 430/343 |
| 5,380,622 | 1/1995 | Roser | 430/343 |
| 5,437,952 | 8/1995 | Hirai et al. | 430/83 |
| 5,441,850 | 8/1995 | Marshall et al. | 430/336 |
| 5,466,557 | 11/1995 | Haley et al. | 430/278 |
| 5,491,046 | 2/1996 | De Boer et al. | 430/302 |
| 5,631,119 * | 5/1997 | Shinozaki | 430/326 |
| 5,641,608 | 6/1997 | Grunwald et al. | 430/302 |
| 5,658,708 | 8/1997 | Kondo | 430/288.1 |
| 5,705,308 * | 1/1998 | West et al. | 430/165 |
| 5,705,309 | 1/1998 | West et al. | 430/325 |
| 5,725,994 | 3/1998 | Kondo | 430/270.1 |
| 5,731,123 | 3/1998 | Kawamura et al. | 430/176 |
| 5,741,619 | 4/1998 | Aoshima et al. | 430/175 |
| 5,759,742 | 6/1998 | West et al. | 430/278.1 |
| 5,786,125 | 7/1998 | Tsuchiya et al. | 430/272.1 |
| 5,840,467 * | 11/1998 | Kitatani et al. | 430/302 |
| 5,858,626 | 1/1999 | Sheriff et al. | 430/326 |
| 6,060,217 * | 5/2000 | Nguyen et al. | 430/302 |

FOREIGN PATENT DOCUMENTS

| | | |
|---|---|---|
| 0 867 278 | 9/1998 | (EP) . |
| 0 823 327 | 11/1998 | (EP) . |
| 0 894 622 | 2/1999 | (EP) . |
| 1066358 | 4/1967 | (GB) . |
| 1170495 | 11/1969 | (GB) . |
| 1231789 | 5/1971 | (GB) . |
| 1245924 | 9/1971 | (GB) . |
| 1546633 | 5/1979 | (GB) . |
| 1563829 | 4/1980 | (GB) . |
| 1603920 | 12/1981 | (GB) . |
| 2082339 | 3/1982 | (GB) . |
| 62-024241 | 2/1987 | (JP) . |
| 02010355 | 1/1990 | (JP) . |
| 207013 | 2/1995 | (JP) . |
| 07120928 | 5/1995 | (JP) . |
| 302722 | 5/1995 | (JP) . |
| 9264 | 6/1995 | (JP) . |
| 86/02743 | 5/1986 | (WO) . |
| 91/19227 | 12/1991 | (WO) . |
| 93/06528 | 4/1993 | (WO) . |
| 96/02491 | 2/1996 | (WO) . |
| 96/20429 | 7/1996 | (WO) . |
| 97/39894 | 10/1997 | (WO) . |

* cited by examiner

PATTERN-FORMING METHODS

CLAIM TO PRIORITY

This application claims the priority of UK application number 9714172.5, filed Jul. 5, 1997, and is a continuation of PCT/GB98/01957, filed Jul. 2, 1998, both herein incorporated by reference.

FIELD OF THE INVENTION

The present invention relates to a method of forming a desired pattern on a substrate which has coated on it a coating comprising a positive working radiation sensitive composition. The method is suitable for making lithographic printing forms or fine resist patterns of electronic parts such as printed circuits. The method is able to produce positive working resists or, by means of an additional step, negative working resists.

BACKGROUND OF THE INVENTION

The art of lithographic printing is based on the immiscibility of ink, generally an oily formulation, and water, wherein in the traditional method the ink is preferentially retained by the image or pattern area and the water or fountain solution is preferentially retained by the non-image or non-pattern area. When a suitably prepared surface is moistened with water and an ink is then applied, the background or non-image area retains the water whilst the image area accepts ink and repels the water. The ink on the image area is then transferred to the surface of a material upon which the image is to be reproduced, such as paper, cloth and the like. Commonly the ink is transferred to an intermediate material called the blanket which in turn transfers the ink to the surface of the material upon which the image is to be reproduced.

New types of "waterless" lithographic printing employ only an oily ink material and preferentially ink-accepting image areas and ink-repelling non-image areas on the printing form.

A generally used type of lithographic printing form precursor (by which we mean a coated printing form prior to exposure and development) has a light sensitive coating applied to an aluminium base support. Negative working lithographic printing form precursors have a radiation sensitive coating which when imagewise exposed to radiation of a suitable wavelength hardens in the exposed areas. On development the non-exposed areas of the coated composition are removed leaving the image. On the other hand positive working lithographic printing form precursors have a radiation sensitive coating, which after imagewise exposure to radiation of a suitable wavelength becomes more soluble in the exposed areas than in the non-exposed areas, in a developer. In both cases only the image area on the printing form itself is ink-receptive.

The differentiation between image and non-image areas is made in the exposure process where a film is applied to the printing form precursor with a vacuum to ensure good contact. The printing form precursor is then exposed to a light source, comprising UV radiation. In the case where a positive form precursor is used, the area of the film that corresponds to the image in the printing form precursor is opaque so that no light will strike the printing form precursor, whereas the area on the film that corresponds to the non-image area is clear and permits the transmission of light to the coating which becomes more soluble and is removed.

The photoresists used in pattern forming methods for electronic parts such as printed circuits are also classified into two types: negative working and positive working. After exposure to radiation and development, the resist pattern is used as a mask for forming the patterns onto the underlying electronic elements—for example by etching an underlying copper foil. Due to the high resolution demands and the requirements of high resistance to etching techniques, positive working systems are widely used. In particular, in the main there have been used alkali developable positive working photoresists mainly composed of alkali-soluble novolac resins as disclosed in J. C. Streiter, Kodak Microelectronics Seminar Proceedings, 1979, p. 116. The primary active component of such positive working compositions, both in the context of lithographic printing forms and electronic parts, is a naphthoquinonediazide (NQD) derivative.

The types of electronic parts whose manufacture may use a photoresist include printed wiring boards (PWBs), thick- and thin-film circuits, comprising passive elements such as resistors, capacitors and inductors; multichip devices (MDCs); and integrated circuits (ICs). These are all classified as printed circuits.

Imageable compositions may also be applied to masks. The required pattern is formed on the mask, which is then used as a screen in a later processing step, in forming a pattern on, for example, a printing or electronic part substrate.

Common to virtually all commercial applications of positive working systems employing UV radiation over several decades have been compositions comprising alkali soluble phenolic resins and NQD derivatives. The NQD derivatives have been simple NQD compounds used in admixture with resins, or NQD resin esters in which the photoactive NQD moiety has been chemically attached to the resin itself, for example by esterification of the resin with an NQD sulphonyl chloride. The latter compounds were developed primarily as a solution to crystallisation and/or migration of simple NQD compounds within coated films, see, e.g., Reiser, *Photoreactive Polymers,* Wiley-Interscience, 1988. These NQD resin esters have also been used in the electronics industry to restrict migration of NQD compounds in multi-layer resist systems.

As demands on the performances of radiation sensitive coatings have increased UV-based NQD technology has become limiting. In addition, digital and laser imaging technology is making new demands on coatings in both lithography and electronic parts imaging.

One of the reasons for using NQD derivatives in UV systems is their sensitivity to UV radiation. The use of NQD derivatives in non-UV systems is not a natural step to take in response to the growing importance of laser imaging technology. However, there have been proposals to use NQD derivatives in laser systems which require an initial overall exposure to UV radiation.

PCT/GB95/02774 describes a method of forming a lithographic plate by a heat-mode imaging method which comprises coating on a substrate a positive working photosensitive composition which comprises a naphthoquinone diazide ester of a phenolic resin, or a naphthoquinone diazide ester and a phenolic resin, and at least one substance which absorbs infra-red radiation, overall exposing the assembly to UV radiation to render the photosensitive composition developable, imaging the plate by means of a laser which emits in the infra-red region of the spectrum and then developing the plate to remove those areas of the photosensitive composition not exposed to the laser.

U.S. Pat. No. 4,544,627 describes a composition containing an o-quinonediazide compound, and a method in which there is firstly an overall exposure to "actinic radiation," followed by an imagewise exposure to a laser beam. "Actinic radiation" is defined as "radiation to which the o-quinone diazide compound is sensitive to be converted to the corresponding indene carboxylic acid." It is said to be "generally, light having the wavelength from about 290 nm to about 500 nm although an electronic beam can also be used." On development only the regions of the coating unexposed to the laser beam are dissolved.

U.S. Pat. No. 5,631,119 discloses a process in which a composition containing an o-quinonediazide compound is exposed on its entire surface to light rays of wavelength about 290–500 nm to render the o-quinonediazide compound soluble in an alkaline developer, imagewise heating the composition, and then developing, to remove only those areas which have not been heated. Imagewise heating may employ infrared rays and an infrared-absorbing dye within the composition.

It will be noted that in each of these procedures the first step is an overall exposure of the coating to UV or near-UV radiation. Thus, although these are laser imaging systems the sensitivity of the NQD moieties to UV radiation is still utilized, by means of the preliminary overall UV exposure step required, and is an essential requirement of the procedures; save for the electron beam possibility additionally proposed (but not exemplified) in U.S. Pat. No. 4,544,627.

There have also been disclosures of positive working compositions containing quinonediazide moieties.

U.S. Pat. No. 5,200,292 discloses positive working compositions containing a resin and a) an aromatic diazo compound, for example a naphthoquinonediazide, and b) a cationic dye/borate anion complex. The anionic dyes exemplified have their peak absorbency from 428 nm to 740 nm.

U.S. Pat. No. 5,227,473 discloses positive working compositions containing novel compounds having a) a decomposable quinonediazide residue Q and b) a light absorbing portion S. The compounds have spectral sensitization with respect to visible light, which is said to be able to decompose the compounds efficiently. It is said to be important that the light absorbing portion S and the quinonediazide residue Q reside at very close separation. The examples employ light whose components of wavelength below 460 nm are filtered out.

We have now discovered to our surprise that diazide-containing compositions (which may be tried and tested compositions for UV systems) may be straightforwardly imaged in positive working methods by means of radiation, which is not the conventional UV radiation.

SUMMARY OF THE INVENTION

In accordance with the present invention there is provided a method for producing a predetermined resist pattern on a substrate, the method comprising: the patternwise application of radiation to a precursor which comprises the substrate, having a coating thereon, the coating comprising a positive working composition; and the application to the coating of a developer; wherein the composition comprises a polymeric substance and diazide moieties, wherein the composition has the property that it is developer insoluble prior to delivery of the radiation and developer soluble thereafter, wherein the radiation is entirely or predominantly direct heat radiation or electromagnetic radiation of wavelength exceeding 500 nm.

DETAILED DESCRIPTION OF THE INVENTION

Preferably the polymeric substance in the absence of the diazide moieties is significantly more soluble in a selected developer, than the corresponding polymeric substance in the presence of the diazide moieties. Preferably, in practical terms it may be regarded as a soluble polymeric substance.

Examples of suitable polymeric substances may be selected from phenolic resins; polymers of styrenes, for example 4-hydroxystyrene, 3-methyl-4-hydroxystyrene and 4-methoxystyrene, acrylic acids including methacrylic acid and acrylic acid, maleiimide, maleiic acid and maleiic acid anhydride; in each case, as homopolymers, co-polymers or terpolymers.

Novolac resins are useful in this invention, suitably being condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane, and appropriate aldehydes, for example formaldehyde, chloral, acetaldehyde and furfuraldehyde. The type of catalyst and the molar ratio of the reactants used in the preparation of phenolic resins determines their molecular structure and therefore the physical properties of the resin. An aldehyde: phenol ratio between 0.5:1 and 1:1, preferably 0.5:1 to 0.8:1 and an acid catalyst is used to prepare those phenolic resins generally known as novolacs which are thermoplastic in character. Higher aldehyde:phenol ratios of more then 1:1 to 3:1, and a basic catalyst would give rise to a class of phenolic resins known as resoles, and these are characterised by their ability to be thermally hardened at elevated temperatures.

Most preferably the polymeric substance is a phenolic resin. Particularly useful phenolic resins in this invention are the condensation products from the interaction between phenol, C-alkyl substituted phenols (such as cresols and p-tert-butyl-phenol), diphenols (such as bisphenol-A) and aldehydes (such as formaldehyde). Dependent on the preparation route for the condensation a range of phenolic materials with varying structures and properties can be formed. Particularly useful in this invention are novolac resins, resole resins and novolac/resole resin mixtures. Examples of suitable novolac resins have the following general structure

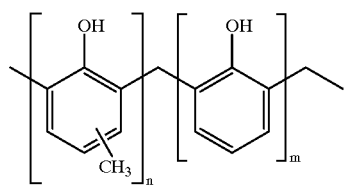

n = m

Diazide moieties used in this invention preferably comprise diazo groups $=N_2$ conjugated to carbonyl groups, preferably via an aromatic or heteroaromatic ring. In such moieties a carbonyl group is preferably bonded to the aromatic or heteroaromatic ring at an adjacent ring position to the diazo group. Preferred moieties are o-benzoquinonediazide (BQD) moieties (often referred to as o-quinonediazides) and o-napthoquinonediazide (NQD) moieties.

A BQD moiety may, for example, comprise the 1,4- or, preferably 1,2-benzoquinonediazide moiety.

An NQD moiety may, for example, comprise the 1,4-, 2,1- or, most preferably, the 1,2-naphthoquinone diazide moiety.

Generally, NQD moieties are preferred to BQD moieties in the practice of the invention.

Most preferred in the practice of the present invention is the 1,2-naphthoquinonediazide moiety.

Suitably the composition comprises a BQD or NQD ester of a phenolic polymeric substance or a BQD or NQD compound, for example an ester, and a phenolic polymeric substance in admixture. The preferred esters are sulphonate esters.

Examples of preferred naphthoquinone diazide moieties which may be used in the photosensitive composition are disclosed in a variety of publications such as U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,036,123, 3,061,430, 3,102,809, 3,105,465, 3,635,709, and 3,647,443. Among these, preferred are o-naphthoquinonediazido sulphonates or o-naphthoquinonediazido carboxylates of aromatic hydroxyl compounds; o-naphthoquinone diazido sulphonic acid amides or o-naphthoquinonediazido carboxylic acid amides of aromatic amine compounds, for instance, esters of naphthoquinone-1,2-diazido sulphonic acid with polyhydroxyphenyl; esters of naphthoquinone-1,2-diazido-4-sulphonic acid or naphthoquinone-1,2-diazido-5-sulphonic acid with pyrogallol/acetone resins; esters of naphthoquinone-1,2-diazidosulphonic acid with novolac-type phenol/formaldehyde resins or novolac-type cresol/formaldehyde resins; amides of poly(p-aminostyrene) and naphthoquinone-1,2-diazido-4-sulphonic acid or naphthoquinone-1,2-diazido-5-sulphonic acid; esters of poly (p-hydroxystyrene) and naphthoquinone-1,2-diazido-4-sulphonic acid or naphthoquinone-1,2-diazido-5-sulphonic acid; and amides of polymeric amines with naphthoquinone-1,2-diazido-4-sulphonic acid. The term "ester" used herein also includes partial esters.

We will now describe the formation of a desired pattern on a substrate, by means of a method as defined above. The substrate could, for example, be a coated lithographic printing form precursor, or a coated electronic substrate. Preferably the composition is such that it is patternwise solubilized by heat In certain embodiments of the invention heat is patternwise delivered conductively to the composition, by direct application. For example the composition may be contacted by a heat stylus; or the reverse face of a support surface onto which the composition has been coated may be contacted by a heat stylus.

In other embodiments of the invention non-UV electromagnetic radiation is used to expose the composition, the wavelength thereof entirely or predominantly exceeding 500 nm. Preferably, it is of wavelength entirely or predominantly exceeding 600 nm. More preferably it is of wavelength entirely or predominantly exceeding 700 nm. Most preferably it is of wavelength entirely or predominantly exceeding 800 nm. Suitably it is of wavelength entirely or predominantly below 1400 nm. More preferably it is of wavelength entirely or predominantly below 1200 nm. Most preferably it is of wavelength entirely or predominantly below 1100 nm. Thus, suitably it is of wavelength entirely or predominantly in the range 600 to 1400 nm, more preferably 700 to 1200 nm, most preferably 800 to 1100 nm. The electromagnetic radiation is preferably converted to heat, either directly or by a chemical reaction undergone by a component of the composition. The electromagnetic radiation could for example be infra-red or visible radiation. Infra-red radiation is preferred, preferably delivered by a laser.

In order to increase the sensitivity of the heat-sensitive compositions of the present invention it is beneficial in embodiments using electromagnetic radiation to include an additional component, namely a radiation absorbing compound capable of absorbing the incident electromagnetic radiation and converting it to heat (hereinafter called a "radiation absorbing compound"). Preferably, however, the compositions do not comprise a cationic dye/borate-anion complex of the type described in U.S. Pat. No. 5,200,298, wherein the anion is of the formula $(R_1)(R_2)(R_3)(R_4)B^-$ where $R_1$–$R_4$ are as defined therein. Preferably, also, the compositions do not comprise compounds of the formulae given in U.S. Pat. No. 5,227,473, containing a light absorbing portion in close proximity and on the same molecule as a quinonediazide residue. The present invention has been found to be effective using simple quinonediazide/resin compositions of the type which have been used for many years in conventional UV imaging. Accordingly complex solutions of the type described in U.S. Pat. Nos. 5,200,298 and 5,227,473 are not necessary and so are not preferred.

The present invention is believed not to rely upon the chemical decomposition of the diazide moieties; whilst there may be some decomposition which may play some part in the pattern-forming process this is believed to be of minor significance. Preferably, therefore, the process of the present invention is carried out substantially without chemical decomposition of the diazide moieties or with a level of chemical decomposition of the diazide moieties which is of minor significance in the pattern-forming process.

In compositions intended to require infra-red radiation for imagewise exposure the composition may be exposed directly by means of a laser. Preferably the laser emits radiation at above 600 nm, more preferably at above 700 nm and most preferably at above 800 nm. In such compositions a suitable radiation absorbing compound, to convert the infra-red radiation to heat, may be a black body radiation absorber, such as carbon black or graphite. It may be a commercially available pigment such as Heliogen Green as supplied by BASF or Nigrosine Base NGI as supplied by NH Laboratories Inc or Milori Blue (C.I. Pigment Blue 27) as supplied by Aldrich.

In a preferred method the coated plate is imagewise exposed directly by a laser. Most preferably the laser emits radiation at a wavelength above 600 nm and the radiation absorbing compound is usefully an infra-red absorbing dye.

Examples of lasers which can be used include semiconductor diode lasers emitting at between 500 nm and 1400 nm, preferably between 600 nm and 1200 nm, more preferably between 700 nm and 1100 nm. An example is the Nd YAG laser which emits at 1064 nm, but any laser of sufficient imaging power and whose radiation is absorbed by the composition, can be used.

Preferably the infra-red absorbing compound is one whose absorption spectrum is significant at the wavelength output of the laser used. Usefully it may be an organic pigment or dye such as phthalocyanine pigment. Alternatively it may be a dye or pigment of the squarylium, merocyanine, cyanine, indolizine, pyrylium or metal dithioline classes.

In compositions intended to require visible radiation for imagewise exposure the compositions may suitably contain a black body absorber, for example carbon black or graphite, or a triazine compound "tuned" to absorb visible light.

Masks are used in some imaging methods, whether in the context of printing or circuit board substrates, with the required resist pattern being formed on the mask, which is then used as a screen in a later processing step. One example of such a process is the flexographic process, as described in

*Advances in Printing Plate Technology* by S. Doyle, ISBN 1858020875. Some masks may require the removal of only a proportion of the full depth of the composition where exposed, rather than the full depth thereof.

The heat sensitive compositions described herein may be coated onto a film, and heat-imaged, and developed, to provide a mask. The mask may be imaged to leave the composition thereon in different depths at different locations, after development. Such a mask may then be applied over a printing substrate and flood exposed, for example using a UV light source.

Suitably the radiation absorbing compound, when present, constitutes at least 0.25%, preferably at least 0.5%, more preferably at least 1%, most preferably at least 2%, of the total weight of the composition. Suitably the radiation absorbing compound, when present, constitutes, up to 25%, preferably up to 20%, and most preferably up to 15%, of the total weight of the composition. Thus a preferred weight range for the radiation absorbing compound may be expressed as 2–15% of the total weight of the composition. More specifically, in the case of dyes the range may preferably be 0.25–15% of the total weight of the composition, preferably 1–6%, whilst in the case of pigments the range may preferably be 1–25%, preferably 2–15%. For pigments, 5–15% may be especially suitable. In each case the figures given are as a percentage of the total weight of the dried composition. There may be more than one radiation absorbing compound. References herein to the proportion of such compound(s) are to their total content.

Pigments are generally insoluble in the compositions and so comprise particles therein. Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they do not have any marked effect on the solubility of the unheated composition, in the developer. In contrast dyes are generally soluble in the compositions. Generally they are narrow band absorbers, typically able efficiently to absorb electromagnetic radiation and convert it to heat only over a range of wavelengths typically not exceeding 100 nm, and so have to be selected having regard to the wavelength of the radiation which is to be used for imaging. Frequently they have a marked effect on the solubility of the unheated composition in the developer, typically making it much less soluble.

The compositions of the invention may contain other ingredients such as stabilising additives, inert colorants, and additional inert polymeric binders as are present in many lithographic plate compositions.

The major proportion of the composition is preferably constituted by polymeric substance(s). Preferably a minor proportion of the composition is constituted by additional components, when present.

A major proportion as defined herein is suitably at least 50%, preferably at least 65%, most preferably at least 80%, of the total weight of the composition.

A minor proportion as defined herein is suitably less than 50%, preferably up to 20%, most preferably up to 15%, of the total weight of the composition.

In one preferred embodiment, of the invention an additional layer comprising a radiation absorbing compound can be used. This multiple layer construction can provide routes to high sensitivity as larger quantities of absorber can be used without affecting the function of the image forming layer. In principle any radiation absorbing material which absorbs sufficiently strongly in the desired band can be incorporated or fabricated in a uniform coating. Dyes, metals and pigments (including metal oxides) may be used in the form of vapor deposited layers. Techniques for the formation and use of such films are well known in the art, for example as described in EP 0,652,483.

The preferred components in the present invention in the context of lithography are those that are hydrophilic as the uniform coating, or which can be treated to provide a hydrophilic surface, for example by use of a hydrophilic layer. However the invention is also applicable to waterless lithography.

The base which can be used as the support may be a semiconductor or conductor in the context of electronic circuitry, and in the context of lithography may be an aluminium plate which has undergone the usual anodic, graining and post-anodic treatments well known in the lithographic art for enabling a radiation sensitive composition to be coated thereon and for the surface of the support to function as a printing background. Another base material which may be used in the present invention in the context of lithography is a plastic material base or a treated paper base as used in the photographic industry. A particularly useful plastic material base is polyethylene terephthlate which has been subbed to render its surface hydrophilic. Also a so-called coated paper which has been corona discharge treated can be used.

The invention requires the use of a composition comprising a polymeric substance and diazide moieties. The diazide moieties may be present as simple compounds admixed with the polymeric substance or, as is preferred, as moieties covalently bonded to the polymeric substance. It should be noted that moieties Q, not comprising diazide moieties, may additionally be covalently bonded to the polymeric substance; or may advantageously be functional groups of an additional polymeric substance, within the composition.

Apart from the fact that they do not comprise diazide moieties, such moieties Q may be further characterised by one or more of the following features:

they are preferably not chemically decomposed on exposure to said radiation. By "not chemically decomposed" we mean that covalent bonds are not broken by exposure to said radiation to any extent which is significant in the effectiveness of the method. Further, they preferably do not produce a gas on exposure to radiation.

they preferably do not comprise acid groups or acid generating groups protected by labile protective groups removed on exposure to said radiation.

preferably they assist the solubility changes referred to above and are not additionally primarily responsible for the absorption of said radiation.

there is preferably hydrogen bonding between said functional groups Q and other groups of the same molecule or other molecule(s) of the polymeric substance. It is believed that heat breaks down the hydrogen bonding with no primary structure decomposition i.e. no covalent bond breaking is believed to be required for the effectiveness of the method.

Although the manner in which such further groups Q are bonded to the polymeric substance may not be significant, preferably a corresponding unfunctionalised polymeric substance has hydroxy groups, which are functionalised by the groups Q. Preferably the polymeric substance having functional groups Q thereon has hydroxy groups. The functional groups Q may covalently bond to the polymeric substance through reaction with hydroxy groups thereof, but preferably not all of the hydroxy groups are thereby reacted.

The functional groups Q, when present in the composition, thus suitably enable hydrogen bonding with moieties of the functionalised polymer, whether of the same molecule or an adjacent molecule, or molecules. Suitable functional groups Q known to favor hydrogen bonding include amino, monoalkylamino, dialkylamino, amido, monoalkylamido, dialkylamido, chloro, fluoro, carbonyl, sulphinyl and sulphonyl groups.

Preferably the functional groups Q, when present, are bonded to the polymeric substance by an esterification reaction to form a resin ester.

Preferably Q represents a group of formula —T—Z where T represents a moiety which can hydrogen bond to the polymer chain R of the same molecule or an adjacent molecule or molecules and Z represents a further non-diazide moiety which may or may not hydrogen bond to the polymer chain R of the same molecule or an adjacent 5 molecule or molecules. In such cases the polymer chain R requires other substituents which can participate in the hydrogen bonding, for example thiol or, most preferably, hydroxy groups.

Suitably Q represents a group of formula —O—T$^1$—Z where T$^1$ is a moiety which can hydrogen bond to the polymer chain R of the same molecule or an adjacent molecule or molecules. Suitably T$^1$ represents a carbonyl group, a sulphinyl group or a sulphonyl group. Preferably it represents a carbonyl or, especially, a sulphonyl group.

One group Q may be covalently bonded to the polymeric resin at more than one site thereof, to form a cyclic structure. For example Q may be defined as being a group of formula —O—X(Z)—O— where X represents a linking moiety and Z represents a said further moiety. This may occur, for example, in certain phosphorus-modified novolac resins, produced by reaction with phosphoric acids or phosphorus oxyhalides.

Preferably a linking moiety X can hydrogen bond to the polymer chain R of the same molecule or an adjacent molecule or molecules.

In such embodiments, a linking moiety X may suitably be a group of formula —P(O)—.

A moiety Z may for example be an optionally substituted alkyl, alkenyl, alkynyl, cycloalkyl, aryl, heteroaryl, non-aromatic heterocyclic, aralkyl or heteroaralkyl group.

Unless otherwise indicated in this specification, the following definitions apply to the definition of the moiety Z:

an alkyl, alkenyl or alkynyl group may be linear or branched and may contain up to 10, preferably up to 8, carbon atoms, suitable examples being methyl, ethyl, propyl, butyl, pentyl, hexyl, heptyl, octyl, vinyl, allyl and propargyl. Unbranched groups may be preferred but branched groups may be employed.

a cycloalkyl group may contain from 3 to 10, preferably 3 to 8, carbon atoms, and is suitably cyclopropyl or cyclohexyl.

the alkylene portion of an aralkyl or heteroaralkyl group is suitably a $C_{1-4}$ alkylene group, especially methylene (—CH$_2$—).

aryl groups are preferably naphthyl or phenyl.

aralkyl groups are preferably ($C_{1-4}$ alkyl) phenyl or ($C_{1-4}$ alkyl) naphthyl, especially benzyl or naphthylmethyl.

heteroaromatic or heterocyclic groups suitably are respectively aromatic or non-aromatic groups, containing within the carbon atom ring or rings 1 to 4 hetero atoms independently selected from oxygen, sulphur and nitrogen. Fused heteroaromatic or heterocyclic groups may be employed but preferably the group is a single ring having 5 or 6 atoms in the ring. Especially preferred is thienyl.

in relation to optional substituents of the 5 aliphatic moieties set out above, namely alkyl, cycloalkyl, alkenyl, alkynyl and heterocyclic (nonaromatic) groups and of the alkylene portions of the aralkyl and heteroaralkyl groups, specific examples of such substituents include halo, nitro, cyano, carbonyl, hydroxy, thiol, amino, mono-($C_{1-4}$ alkylamino, di-$C_{1-4}$ alkylamino, amido (—CONH$_2$), mono-$C_{1-4}$ alky) amido (—CONHR$^1$), di-($C_{1-4}$ alkyl)amido (—CONR$^1$R$^2$), $C_{1-4}$ alkoxy, $C_{1-4}$ haloalkoxy, —COOH, ($C_{1-4}$ alkyl)carbonylamino groups (R$^3$C(O)NH—), for example acetamido), ($C_{1-4}$ alkyl)carbonyl and ($C_{1-4}$ alkoxy)carbonyl groups. Good results have however, been obtained using aliphatic moieties which are unsubstituted.

in relation to optional substituents of an aryl or heteroaryl moiety set out above, including of an aralkyl or heteroaralkyl group, optional substituents include halo, nitro, cyano, hydroxy, thiol, amino, mono-$C_{1-4}$ alkylamino, di-$C_{1-4}$ alkylamino, amido (—CONH$_2$), mono-($C_{1-4}$ alkyl) amido (CONHR$^1$), di-($C_{1-4}$ alkyl) amido (CONR$^1$R$^2$) amido (CONHR$^1$), di-($C_{1-4}$ alkyl) amido (CONR$^1$R$^2$), $C_{2-4}$ alkenyl, $C_{1-4}$ alkyl, $C_{1-4}$ alkoxy, —COOH, ($C_{1-4}$ alkyl) carbonylamino (R$^3$C(O)NH—, for example acetamido), ($C_{1-4}$ alkyl) carbonyl and ($C_{1-4}$ alkoxy) carbonyl. When there is substitution of said aryl or heteroaryl groups 1 to 3 substituents may suitably be employed. Alkyl, alkylamino, alkylamido, alkenyl, alkoxy, alkylcarbonyl, alkoxycarbonyl moieties carried by said aryl or heteroaryl groups are preferably unsubstituted but may be substituted by substituents selected from the list given above for aliphatic moieties.

a halo moiety is preferably a fluoro, chloro or 5 bromo group.

Preferably the moiety Z is an optionally substituted aryl, heteroaryl or alkyl group. An especially preferred aryl group is a phenyl or naphthyl group optionally substituted by 1–3 moieties independently selected from hydroxy, halo, $C_{1-4}$ alkyl (especially methyl), $C_{1-4}$ haloalkyl (especially CF$_3$), $C_{1-4}$ alkoxy (especially methoxy), amino, mono-($C_{1-4}$ alkyl) amino (especially methylamino) and di-($C_{1-4}$ alkyl) amino (especially dimethylamino). An especially preferred aryl group is a naphthyl group, a dansyl group, a phenyl group or a 4-methylphenyl group. An especially preferred optionally substituted alkyl group is a $C_{2-8}$ alkyl group, especially a n—$C_{3-6}$ alkyl group.

One composition of the invention comprises an unfunctionalised phenolic resin, in admixture with simple diazide-containing compounds.

Another composition of the invention comprises a phenolic resin, to hydroxy groups of which moieties selected from —O—SO$_2$-tolyl, —O-dansyl, —O—SO$_2$-thienyl, —O—SO$_2$-naphthyl and —O—CO—Ph are bonded, in admixture with simple diazide-containing compounds.

Another composition of the invention comprises a phenolic resin, to hydroxy groups of which sulphonyl diazide moieties are bonded, and to further hydroxy groups of which moieties selected from —O—SO$_2$-tolyl, —O-dansyl, —O—SO$_2$-thienyl, —O—SO$_2$-naphthyl and —O—CO—Ph are bonded.

Resins bearing diazide groups and groups Q as separate functional groups, examples being described in the previous paragraph, constitute a further aspect of the present invention, along with methods for their preparation, suitably by co-esterification.

In the specification when we state that a composition is developer soluble we mean that it is soluble in a developer, to an extent useful in a lithographic printing form development process or a photoresist development process. When we state that a composition is developer insoluble we mean that it is not soluble in a developer, to an extent useful in a lithographic printing form development process or a photoresist development process.

The composition is preferably used as a coating on a precursor for a lithographic printing form or an electronic part or a mask to be used as a screen in the later exposure of a separate part, such as a lithographic printing form or an electronic part precursor. The mask substrate is suitably a plastic film.

A positive working lithographic printing form or electronic part or mask is obtained after patternwise irradiation and processing of a precursor. On patternwise exposure, the exposed areas of the composition are rendered more soluble in the developer. The developer solubility of the coated composition is such that there is no significant coating loss in the non-image areas on development of the image areas. Therefore, on imagewise exposure there is a change in the solubility differential of the unexposed composition and of the exposed composition. Thus, in the exposed areas the composition is dissolved to form the pattern.

The coated printing form or electronic circuit or mask precursors may be heat imaged indirectly by exposure to a short duration of high intensity radiation transmitted or reflected from the background areas of a graphic original located in contact with the recording material.

In another aspect of the invention the coated printing form or electronic circuit or mask precursors may be patternwise heated using a heated body. For example the reverse face of a support surface onto the front face of which the heat sensitive composition is coated or, preferably, the heat sensitive composition itself may be contacted by a heat-stylus.

In another aspect of the invention the coated printing form or electronic circuit or mask precursors is exposed by means of suitable radiation, as defined above, to heat the coating patternwise.

The developer composition is dependent on the nature of the components of the composition, but is preferably an aqueous composition. Common components of aqueous developers are surfactants, chelating agents such as salts or ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer containing inorganic or organic metasilicates when the polymeric substance, as is preferred, is a phenolic resin.

In accordance with a further aspect of the present invention there is provided a printing plate or electronic part or mask to be used as a screen in a later flood exposure step, carried out to image on a separate part, in each case having a pattern formed in the coating thereof by means of the method of the present invention.

The method of the invention as set out above is a positive working method, but it has also been determined that by means of a further step a negative working method is possible. This requires an overall exposure to UV radiation subsequent to the patternwise application of radiation, and prior to the application to the coating of the developer. It is then found that the areas of the coating not exposed to the patternwise radiation dissolve. This constitutes a further aspect of the present invention. The method of the invention has the substantial advantage in that it offers a positive working system, achieved by only one exposure step, that exposure not requiring UV radiation. Then, even the negative working embodiment of the invention involving subsequent overall exposure to UV radiation offers a significant advantage, in that it improves the work-flow for commercial printers who prefer to image the plate before it is processed in an apparatus which includes the UV source.

Simple tests, tests 1 to 5 below, may be carried out to determine if the composition comprising the polymeric substance, the selected developer and hydrophilic support, are together likely to be suitable for the positive working method of the present invention, in the context of lithographic printing. For simplicity these tests involve the direct delivery of heat, whereas the delivery of heat to the composition in use may be direct or via conversion of incident electromagnetic or charged-particle beam radiation, as described above.

Test 1

The composition comprising the polymeric substance without the diazide moieties being present is coated on a suitable hydrophilic support and dried. Then the surface is inked-up. If a uniform inked coating is obtained then the polymeric substance is ink-accepting when laid down as a coating.

Test 2 (optional)

The support coated with the composition comprising the polymeric substance without the diazide moieties being present is processed in the selected developer for a suitable time which may be determined by trial and error but will typically be between 15 to 120 seconds, at room temperature, and then rinsed, dried and inked-up. If no ink surface is obtained then the polymeric substance has dissolved in the developer.

Test 3

The composition comprising the polymeric substance and the diazide moieties is coated on the support, dried and inked-up. If a uniform inked coating is obtained then the composition is ink-accepting when laid down as a coating.

Test 4

The support coated with the composition comprising the polymeric substance and the diazide moieties is processed in the selected developer for a suitable time which may be determined by trial and error but will typically be between 15 to 120 seconds, at room temperature, and then rinsed, dried and inked-up. If a uniform inked coating is obtained then the composition is insoluble in the developer.

Test 5

The support coated with the composition comprising the polymeric substance and the diazide moieties is heated, for example in an oven or by use of a heated body placed in contact with it, such that the composition reaches a suitable temperature for an appropriate period of time. Then it is processed in the selected developer for an appropriate period of time at room temperature. The surface is then dried and inked-up. If no ink surface is obtained then the heated composition has dissolved in the developer. The temperature and time for the heating stage depend on the components selected for the composition and on their proportion. Simple trial and error experiments may be undertaken to determine suitable conditions. Initial failures may therefore not be determinative but if there is a persistent inability to obtain a pass result, despite reasonable efforts, the conclusion must be that the composition has failed this test. Preferably, a typical composition may be heated such that the composition, for example based on a phenolic resin, reaches a temperature of 50° C. to 180° C. for 5 to 20 seconds. Then it is processed in the selected developer for a suitable period of time which may be determined by trial and error but will typically be 15 to 120 seconds, at room temperature. Most preferably, the functionalised polymeric substance is heated such that the composition reaches a temperature of 100° C. to 160° C. for 5 to 20 seconds. Then it is processed in the selected developer typically for 15 to 120 seconds at room temperature.

If the composition can pass these tests then it is suitable for use on a lithographic printing plate in the positive working method of the present invention provided of course that in embodiments involving the conversion of non-UV electromagnetic radiation to heat, the appropriate radiation therefor is delivered, having regard to any radiation absorbing compound which is present. Equally, a composition passing these tests is likely to fulfil the requirements for the negative working method involving subsequent overall exposure to UV radiation provided again that the appropriate UV radiation therefor is delivered. Equally, a composition passing these tests is likely to fulfil the requirements for a photoresist for electronic circuits or masks, whether in positive or negative modes. However, the aspects of the above tests which determine ink-accepting properties are irrelevant in this context and can be dispensed with.

Any feature of any aspect of the present invention or embodiment described herein may be combined with any feature of any other aspect of the invention or embodiment described herein.

EXAMPLES

The following examples more particularly serve to illustrate the various aspects of the present invention described hereinabove.

Starting Materials

The following products are referred to hereinafter.

LB6564—a 1:1 phenol/cresol novolac resin supplied by Bakelite, UK.
LB744—a cresol novolac supplied by Bakelite.
LG724—a phenol novolac resin supplied by Bakelite.
214-NQD chloride—the compound:

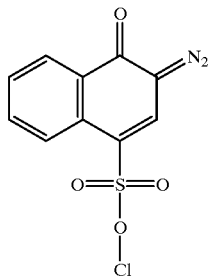

supplied by A. H. Marks of Bradford, UK.
NW6564—the resin produced when LB6564 (100 g) was reacted with 214-NQD chloride (18 g) by the method set out below.
HSL-A—the resin produced when LB6564 (100 g) was reacted with 214-NQD chloride (18 g) and m-chlorosulphonylbenzoic acid (11 g) by the method set out below.
HSL-B—the resin produced when a mixture of LB744 (60 g) and LB6564 (40 g) was reacted with 214-NQD chloride (18 g) and m-chlorosulphonylcinnamic acid (7.5 g) by the method set out below.
HSL-C—the resin produced when LB6564 (100 g) was reacted with 214-NQD chloride (18 g) and tosyl chloride (9.5 g) by the method set out below.

Dye A—KF654B PINA as supplied by Riedel de Haan UK, Middlesex, UK, believed to have the structure:

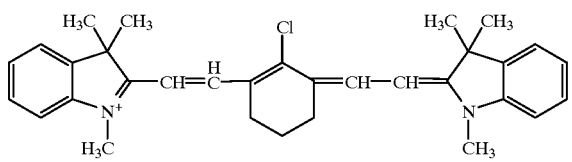

PC-A—the photoactive compound 2,4-dihydroxybenzophenone bis(6-diazo-5,6-dihydro-5-oxo-1-naphthalene sulphonate) supplied by A. H. Marks, Bradford, UK., having the structure:

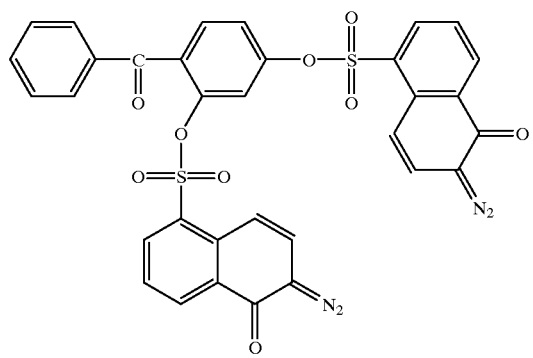

Dye B—the victoria pure blue BO as supplied by Aldrich Chemical Company, Dorset, UK, having the structure:

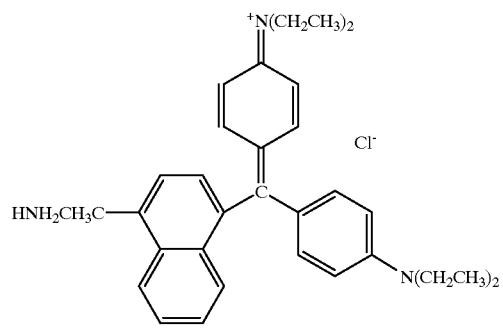

AG-A—the acid generator compound having the structure:

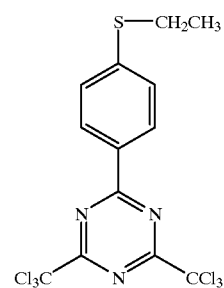

Mon-C—Monazoline C, a cocyl imidazoline IR absorbing dye supplied by Mona Industries Inc., New Jersey, USA, having the following formula:

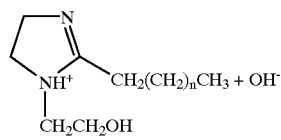

Dye i-I-9—an IR absorbing dye supplied by H. W. Sands Corporation, Florida, USA, having the following formula:

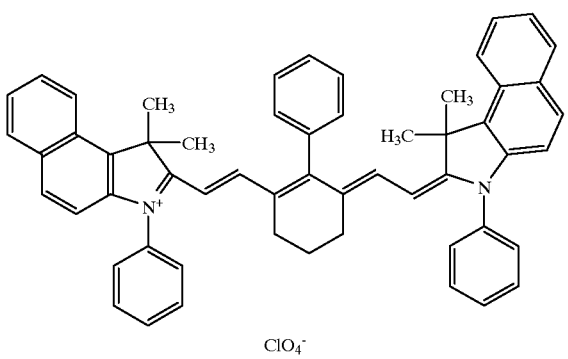

P50X—phenyl methyl siloxane supplied by Aldrich 15 Chemical Company, Dorset, UK.
J1002FTB—cellobond J1002FTB, a phenolic resole supplied by B.P. Chemicals, Sully, Wales.
Developer A—14% wt sodium metasilicate pentahydrate in water.
Developer B—7% wt sodium metasilicate pentahydrate in water.
Oyo Thermal Plotter—a GS618-400 thermal plotter delivering heat to a substrate by direct contact, supplied by Oyo Instruments Inc., Houston, Tex., USA.
Planfoil polyester montage foil (0.18 mm thickness) supplied by Kodak Polychrome Graphics/Horsell, Leeds, UK.
Unless otherwise stated the monomeric chemicals used were supplied by Aldrich Chemical Company, Dorset, England.

The as-supplied resins were modified to make the NQD resin esters by simple reaction with 214-NQD chloride. An example follows.

1. Dissolve 25.0 g of the desired phenolic resin in 61.8 g of 2-methoxy ethanol.
2. Immerse a three-necked 500 ml round-bottomed flask in a water bath placed on a hot plate/stirrer. Attach a stirrer gland, stirring rod and a thermometer to the flask.
3. Place the resin solution into the flask whilst being rapidly stirred.
4. Slowly add 25.6. g of distilled water drop-wise keeping precipitation to a minimum.
5. Add sodium hydrogen carbonate (4.3 g) to the flask. Not all of the solid will dissolve.
6. Slowly add the acid chloride(s) in the amounts stated above with vigorous stirring.
7. Warm the reaction mire for 6 hours at 40° C. with stirring.
8. After 6 hours, remove the flask from the water bath and allow to cool (about 30 mins).
9. Prepare a dilute solution by adding 8.6 g 1.18 s.g. hydrochloric acid to 354 g of distilled water.
10. Slowly precipitate the esterified resin drop-wise into the dilute acid with stirring.
11. Filter and wash the precipitate by re-slurrying in distilled water at least three times if possible until the pH of the filtrate reaches 6.0. In practice, it may only reach 5.5.
12. Dry the precipitate in a vacuum oven at 40° C.

Examples 1–6

Laser Thermal Imaging of NOD Resin Ester Systems—Positive Working

Coating formulations for examples 1 to 6 below were prepared as solutions in 1-methoxypropan-2-ol. The substrate used was a 0.3 mm sheet of aluminum that had been electrograined and anodised and post-anodically treated with an aqueous solution of an inorganic phosphate. The coating solutions were coated onto the substrate by means of a wire wound bar. The solution concentrations were selected to provide the specified dry film compositions with a coating weight of 2.0 $gm^{-2}$ after thorough drying at 100° C. in an oven for 3 minutes.

|  | Examples | | | | | |
| --- | --- | --- | --- | --- | --- | --- |
|  | 1 | 2 | 3 | 4 | 5 | 6 |
| Component | Parts by Weight | | | | | |
| NW6564 | 76 | 74 | 71 | 69 | 71 | 69 |
| LG724 | 20 | 20 | 20 | 20 |  |  |
| Dye A | 2 | 2 | 2 | 2 | 2 | 2 |
| Dye B | 2 | 2 | 2 | 2 | 2 | 2 |
| AG-A |  | 2 |  | 2 |  | 2 |
| P50X |  |  | 5 | 5 | 5 | 5 |
| J1002FTB |  |  |  |  | 20 | 20 |

Samples of the plates were then imaged. The coated substrate to be imaged was cut into a circle of 105 mm diameter and placed on a disc that could be rotated at a constant speed between 100 and 2500 revolutions per minute. Adjacent to the spinning disc a translating table held the source of the laser beam so that the laser beam impinged perpendicular to the coated substrate, while the translating table moved the laser beam radially in a linear fashion with respect to the spinning disc.

The laser used was a single mode 830 nm wavelength 200 mW laser diode which was focused to a 10 micron resolution. The laser supply was a stabilised constant current source.

The exposed image was in the form of a spiral whereby the image in the centre of the spiral represented slow laser scanning speed and long exposure time and the outer edge of the spiral represented fast scanning speed and short exposure time. Imaging energies were derived from the measurement of the diameter at which an image was formed.

The minimum energy that can be delivered by this exposure system is 120 $mJcm^{-2}$ at an rpm of 2500.

The exposed discs were then processed by immersing in Developer A for 180 seconds. Plate sensitivities were then determined. The results are listed in the following table.

| Example | Sensitivity (mJcm$^{-2}$) |
| --- | --- |
| 1 | 200 |
| 2 | 600 |
| 3 | 500 |
| 4 | 600 |
| 5 | 500 |
| 6 | 600 |

Example 7

Laser Thermal Imaging of Simple (Admixed) NOD+Resin Systems—Positive Working

The coating formulation for example 7 was prepared as a solution in 1-methoxypropan-2-ol. The coating solution was coated as described in examples 1 to 6. The solution concentration was selected to provide the specified dry film composition with a coating weight of 2.0 gm$^{-2}$ after thorough drying at 130° C. in an oven for 80 seconds.

| Component | Example 7 Parts by Weight |
| --- | --- |
| LB6564 | 78 |
| PC-A | 20 |
| Dye A | 2 |

Example 7 was imaged using the 830 nm laser imaging device described herein. The exposed sample was processed by immersing in Developer A for 60 seconds. The result is given in the following table.

| Example | Sensitivity (mJcm$^{-2}$) |
| --- | --- |
| 7 | <150 |

Example 8

Image Formation using Ovo Thermal Plotter—Positive Working

Hydrophilic Coating Formulation

The following reagents were used in the preparation:

Sodium silicate having a ratio of 27.1–28.1 wt % $SiO_2$, 8.4–8.8 wt % $NaO_2$, with the balance being water, and a density of about 75 Twaddel (°Tw), equivalent to 39.5 Baume (°Be) and a specific gravity of 1.375.

Deionised water having a resistivity of 5 Mohm.cm.

$Al_2O_3$ powder comprising alumina (99.6%) in the shape of hexagonal platelets. The mean article size is 3 μm. The powder has a hardness of 9 Moh (on a 0–10 hardness scale).

Deionised water (48 g; 24 wt %) and sodium silicate solution (80 g; 40 wt %) were added to a 250 ml beaker and the solution sheared using a Silverson high shear mixer operating at a maximum speed. Titanium dioxide powder (36 g; 18 wt %) was then added in portions of approximately 2 g every ten seconds. On completion of the addition, the liquid was sheared for a further two minutes. Finally, Dowfax® 2A1 (0.18 wt %) was added with stirring. The viscosity of the liquid was found to be about 10 centipoise when measured at 20° C. and a shear rate of 200 s$^{-1}$ using a Mettier Rheomat 180 Viscometer incorporating a double gap measuring geometry.

The support used was polyester montage foil. The hydrophilic layer was coated onto the support using a Meyer bar to give a wet film weight of 8.0 gm$^{-2}$ and oven dried at 130° C. for 80 seconds to produce the hydrophilic surface.

The coating solution next employed was a conventional naphthoquinone diazide-containing UV sensitive positive-working layer of a type which is applied by Kodak Polychrome Graphics/Horsell to light sensitive lithographic printing plates sold under the trade name ARIES®. The coating solution was coated onto the substrate by means of a wire wound bar. The solution concentration was selected to produce a dry coating weight of 2.1 gm$^{-2}$ after thorough drying at 100° C. for 180 seconds in a Mathis labdryer oven (as supplied by Werner Mathis 5 AG, Germany).

The composition was then imaged on the Oyo thermal plotter using the following conditions.

1. 400×400 dpi resolution
2. power set at +20% of the maximum internal figure
3. hysteresis on
4. 0.4 inch per second speed
5. negative image yes and then processed by hand in Developer A at 20° C. for 150 seconds.

It was found that the thermally sensitive coating dissolved away in the developer only where it had received a direct application of heat.

Examples 9–11

Laser Imaging and UV Flood Exposure—Negative Working

Coating formulations for example 9 to 11 were prepared as solutions in 1-methoxypropan-2-ol. The coating solutions were coated as described in examples 1–7. The solution concentrations were selected to provide the specified dry film compositions with a coating weight of 2.0 gm$^{-2}$ after thorough drying at 130° C. for 80 seconds.

| | Examples | | |
| --- | --- | --- | --- |
| | 9 | 10 | 11 |
| Component | Parts by Weight | | |
| Resin HSL-A | 96 | | |
| Resin HSL-B | | 96 | |
| Resin HSL-C | | | 96 |
| Dye A | 2 | 2 | 2 |
| Dye B | 2 | 2 | 2 |

Examples 9–11 were then imaged using the 830 mm laser imaging device described. The examples were next flood exposed on a Montakop UV lightframe using a TH 3020 diazo bulb supplied by Sie.g.fried Theimer GmbH of Germany. This emits UV radiation, predominantly distributed in the wavelength band 400–440 nm. The number of exposure units was 100 with a 20:20 vacuum using a mask (a Stouffer 21 step sensitivity guide). Exposed samples were processed by immersing in Developer B for 10 seconds. Plate sensitivities were then determined. The results are listed in the following table.

| Example | Sensitivity (mJcm$^{-2}$) |
|---|---|
| 9 | 600 |
| 10 | 800 |
| 11 | 1000 |

Example 12

IR and UV Imaging Leading to a Printing Plate— Negative Working

The coating formulation of example 12 was prepared as a solution in 1-methoxypropan-2-ol. The coating solution was coated as described in examples 1–7. The solution concentration was selected to provide a coating film weight of 1.3 gm$^{-2}$ after thorough drying at 100° C. in an oven for 3 minutes.

| Example 12 | | |
|---|---|---|
| Component | Weight (g) | % Solids |
| NW5464 | 2.7 | 87 |
| MON-C | 0.6 | 5 |
| i-l-9L | 0.1 | 8 |

Example 12 was imaged using the 830 nm laser imaging device described herein. The plate was then flood exposed in a light frame using a 3 kw mercury halogen lamp for 90 seconds at a distance of 1 meter. The plate was then processed by immersing in Developer B for 30 seconds. The result is given in the following table.

| Example | Sensitivity (mJcm$^{-2}$) |
|---|---|
| 12 | 400 |

The plate was inked up and printed 100,000 good copies. The run length was extended by baking between 200 and 300° C.

In the specification we refer in various places to UV, infra-red and visible radiation. A person skilled in the art will be aware of the typical wavelength ranges of these radiations, and that there may be an overlap at the margins between definitions of these terms, and also that many sources emit a distribution of wavelengths. However, UV radiation typically has a wavelength range not exceeding about 450 nm. Visible radiation has a wavelength range typically of about 400 to 700 nm. infrared radiation typically has a wavelength range in excess of 600 nm, the boundaries between ultraviolet and visible radiation, and between infrared radiation and visible radiation, not being sharp ones. When we state in this specification that radiation is not UV-radiation we mean that any UV components of the wavelength distribution are minor, not significantly affecting the method. Likewise when we state that radiation is, for example, "predominantly" infrared radiation we mean that whilst there may be non-infrared components in the wavelength distribution these are not significant, in the method.

It will be apparent that a plate which can be imaged in accordance with the invention is flexible in its use. It may be used in imaging methods employing non-UV imaging radiation, in positive working mode, and also following UV flood exposure, in negative working mode. It may also be used in more conventional imaging methods employing UV imaging radiation in positive working mode and also via the process described in GB 2082339, in negative working mode.

Having described the invention, we now claim they invention and its equivalents.

What is claimed is:

1. A method for producing a predetermined resist pattern on a substrate, the method comprising:

patternwise exposing a precursor with radiation, the precursor comprising a coating on the substrate, and forming exposed and unexposed regions of the coating; and applying a developer to the coating and removing the exposed regions of the coating;

in which:

the coating is a positive working composition that comprises a polymeric substance and diazide moieties;

the radiation is either direct heat radiation or electromagnetic radiation whose wavelength is entirely or predominately in the range of 600 to 1400 nm; and the method is carried out substantially without chemical decomposition of the diazide moieties.

2. The method of claim 1 wherein the polymeric substance is a phenolic resin.

3. The method of claim 1 wherein the diazide moieties are benzoquinone diazide or naphthoquinone diazide moieties.

4. The method of claim 1 wherein the diazide moieties are covalently bonded to the polymeric substance.

5. The method of claim 1 wherein said polymeric substance is admixed with a compound comprising the diazide moieties.

6. The method of claim 1 wherein the radiation is electromagnetic radiation delivered by a laser.

7. The method of claim 6 wherein the radiation is converted to heat by the coating.

8. The method of claim 7 wherein the polymeric substance absorbs said electromagnetic radiation and converts said electromagnetic radiation to heat.

9. The method of claim 7 wherein said composition comprises a radiation absorbing compound that absorbs said electromagnetic radiation and converts it to heat.

10. The method of claim 7 wherein said precursor comprises an additional layer, the additional layer disposed between the coating and the substrate, wherein the additional layer comprises a radiation absorbing compound that absorbs said electromagnetic radiation and converts it to heat.

11. The method of claim 1 wherein the precursor is exposed with heat radiation from a heated body.

12. The method of claim 1 wherein the developer is an aqueous alkaline solution.

13. The method of claim 1 wherein the composition comprises a phenolic resins to which hydroxy groups of which sulfonyl diazide moieties are bonded, and to further hydroxy groups of which moieties selected from —O—SO$_2$-tolyl, —O-dansyl, —O—SO$_2$-thienyl, —O—SO$_2$-naphthyl, and —O—CO—Ph are bonded.

14. An imaged article produced by the method of claim 1.

15. A printing form produced by application of the method of claim 1 to a printing form precursor.

16. An electronic part produced by application of the method of claim 1 to an electronic part precursor.

17. The method of claim 7 in which the polymeric substance is a phenolic resin and the diazide moieties are benzoquinone diazide or naphthoquinone diazide moieties.

18. The method of claim 9 in which the radiation absorbing compound is a cyanine dye.

19. The method of claim 18 in which the cyanine dye has the chromophore:

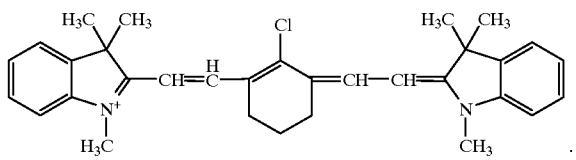

20. The method of claim 10 in which the radiation absorbing compound is a cyanine dye.

21. The method of claim 20 in which the cyanine dye has the chromophore:

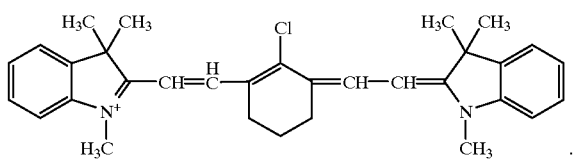

22. The method of claim 2 wherein the diazide moieties are benzoquinone diazide or naphthoquinone diazide moieties.

23. The method of claim 22 wherein
   the polymeric substance is a novolac resin, a resol resin, a novolac/resol resin, or a mixture thereof; and
   the developer is an aqueous alkaline solution.

24. The method of claim 23 wherein the radiation is electromagnetic radiation delivered by a laser.

25. The method of claim 24 wherein the electromagnetic radiation is the range of 700 nm to 1100 nm.

26. The method of claim 25 wherein the polymeric substance is a novolac resin.

27. The method of claim 26 wherein the composition comprises a radiation absorbing compound that absorbs the electromagnetic radiation and converts it to heat.

28. The method of claim 26 wherein the precursor comprises an additional layer, the additional layer disposed between the coating the substrate, wherein the additional layer comprises a radiation absorbing compound that absorbs the electromagnetic radiation and converts it to heat.

* * * * *

UNITED STATES PATENT AND TRADEMARK OFFICE
CERTIFICATE OF CORRECTION

PATENT NO.   : 6,218,083 B1
DATED        : April 17, 2001
INVENTOR(S)  : McCullough et al.

It is certified that error appears in the above-identified patent and that said Letters Patent is hereby corrected as shown below:

Title page,
Item "[73] Assignee", delete "Plychrome" and insert therefor -- Polychrome --
Item "[56] References Cited", under U.S. PATENT DOCUMENTS", delete "5,705,309 1/1998 West et al. 430/325" and insert therefor -- 5,705,309 1/1998 West et al. 430/167 --
Item "[56] References Cited", under U.S. PATENT DOCUMENTS", between "5,705,309..." and "5,725,994..." insert -- 5,705,322 1/1998 West et al. 430/325 --

Column 4,
Line 25, delete "then" and insert therefor -- than --

Column 15,
Line 64, delete "mire" and insert therefor -- mixture --

Column 19,
Line 54, delete "infrared" and insert therefor -- Infrared --

Column 20,
Line 7, delete "they" and insert therefor -- the --
Line 55, delete "resins" and insert therefor -- resin --

Column 22,
Line 19, delete "coating the" and insert therefor -- coating and the --

Signed and Sealed this

Twenty-fifth Day of December, 2001

*Attest:*

*Attesting Officer*

JAMES E. ROGAN
*Director of the United States Patent and Trademark Office*